(12) United States Patent
Koo et al.

(10) Patent No.: US 9,441,290 B2
(45) Date of Patent: Sep. 13, 2016

(54) SYSTEM AND METHOD OF IMPROVING IMPLANT QUALITY IN A PLASMA-BASED IMPLANT SYSTEM

(71) Applicant: Varian Semiconductor Equipment Associates, Inc., Gloucester, MA (US)

(72) Inventors: Bon-Woong Koo, Andover, MA (US); Min-Sung Jeon, Jeonju (KR); Yong-Tae Kim, Gyeonggi-do (KR); Timothy J. Miller, Ipswich, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 592 days.

(21) Appl. No.: 13/904,155

(22) Filed: May 29, 2013

(65) Prior Publication Data

US 2014/0356547 A1      Dec. 4, 2014

(51) Int. Cl.
*C23C 14/48* (2006.01)
*H01J 37/32* (2006.01)

(52) U.S. Cl.
CPC ......... *C23C 14/48* (2013.01); *H01J 37/32412* (2013.01); *H01J 37/32532* (2013.01); *H01J 37/32853* (2013.01)

(58) Field of Classification Search
CPC .............. C23C 14/48; H01J 37/32412; H01J 37/32532; H01J 37/32853
See application file for complete search history.

(56) References Cited

U.S. PATENT DOCUMENTS

| 8,916,056 | B2 * | 12/2014 | Koo | H01J 37/32422 134/1.1 |
| 9,142,392 | B2 * | 9/2015 | Bassom | H01J 37/32853 |
| 2006/0019477 | A1 * | 1/2006 | Hanawa | C23C 14/48 438/514 |
| 2008/0160777 | A1 * | 7/2008 | Ono | C23C 16/4405 438/710 |
| 2009/0104761 | A1 * | 4/2009 | Jeon | H01J 37/32412 438/513 |
| 2009/0236547 | A1 * | 9/2009 | Huang | H01J 37/20 250/492.21 |
| 2011/0024046 | A1 * | 2/2011 | Keil | H01J 37/32091 156/345.48 |
| 2011/0240876 | A1 * | 10/2011 | Sinclair | H01J 27/16 250/423 R |
| 2011/0309049 | A1 * | 12/2011 | Papasouliotis | H01J 37/32146 216/37 |
| 2012/0006351 | A1 * | 1/2012 | Jun | H01J 37/32862 134/1.1 |
| 2012/0145324 | A1 * | 6/2012 | Koshiishi | H01J 37/32082 156/345.29 |
| 2014/0127394 | A1 * | 5/2014 | Gammel | H01J 27/08 427/8 |
| 2014/0326409 | A1 * | 11/2014 | Koshiishi | H01J 37/32082 156/345.29 |

OTHER PUBLICATIONS

Koo, Bon-Woong, Biasing System for a Plasma Processing Apparatus, U.S. Appl. No. 13/649,159, filed Oct. 11, 2012.

* cited by examiner

*Primary Examiner* — Wyatt Stoffa
(74) *Attorney, Agent, or Firm* — Nields, Lemack & Frame, LLC

(57) ABSTRACT

A system and method for the removal of deposited material from the walls of a plasma chamber is disclosed. The system may have two modes; a normal operating mode and a cleaning mode. During the cleaning mode, the plasma is biased at a higher potential than the walls, thereby causing energetic ions from the plasma to strike the plasma wall, dislodging material previously deposited. This may be achieved through the use of one or more electrodes disposed in the plasma chamber, which are maintained at a first voltage during normal operating mode, and a second, higher voltage, during the cleaning mode.

13 Claims, 5 Drawing Sheets

SYSTEM AND METHOD OF IMPROVING IMPLANT QUALITY IN A PLASMA-BASED IMPLANT SYSTEM

Embodiments of the present invention relate to methods and apparatus for improving implant quality in a plasma-based ion implantation system.

BACKGROUND

Semiconductor workpieces are often implanted with dopant species to create a desired conductivity. For example, solar cells may be implanted with a dopant species to create an emitter region. This implant may be done using a variety of different mechanisms. In one embodiment, shown in FIG. 1, an ion implant system 100 is used. This ion implant system 100 includes a plasma chamber 105 defined by several walls 107, which may be constructed from graphite, silicon, silicon carbide or another suitable material. This plasma chamber 105 may be supplied with a source gas via a gas inlet 110. This source gas may be energized by an RF antenna 120 or another mechanism to create plasma 150. The RF antenna 120 is in electrical communication with a RF power supply (not shown) which supplies power to the RF antenna 120. A dielectric window 125, such as a quartz or alumina window, may be disposed between the RF antenna 120 and the interior of the plasma chamber 105. The system 100 also includes a controller 175. The controller 175 may receive input signals from a variety of systems and components and provide output signals to each to control the same.

Positively charged ions 155 in the plasma 150 are attracted to the substrate 160 by the difference in potential between the plasma chamber 105 (which defines the potential of the plasma 150) and the substrate 160. In some embodiments, the walls 107 may be more positively biased than the substrate 160. For example, the walls 107 may be in electrical communication with a plasma chamber power supply 180, which is positively biased. In this embodiment, the substrate 160 is in communication with a platen 130, which is in communication with bias power supply 181, which is biased at a voltage lower than that applied by plasma chamber power supply 180. In certain embodiments, the bias power supply 181 may be maintained at ground potential. In a second embodiment, the plasma chamber power supply 180 may be grounded, while the bias power supply 181 may be biased at a negative voltage. While these two embodiments describe either the substrate 160 or the walls 107 being at ground potential, this is not required. The ions 155 from the plasma 150 are attracted to the substrate 160 as long as the walls 107 are biased at any voltage greater than that applied to the platen 130.

During operation, the ions and various forms of neutral particles in the plasma 150 may be deposited on the walls 107 of the plasma chamber 105. In general, deposition layers are poor in electrical conductivity and may even be electrically insulating. As a result, the plasma 150 is not well-referenced, often causing plasma potential changes, non-uniformity of plasma (causing non-uniform doping on substrate 160), and plasma instability. This deposition of material may be uneven and may affect the conductivity of the walls 107. Specifically, the deposition may be uneven, such that some portions of the walls 107 are coated, while other portions remain exposed. This non-uniform coating may affect the composition of parameters of the plasma, which may negatively impact the substrates being implanted.

In order to provide a reliable electrical reference for the plasma 150, it is desirable to insure that no deposition coating exist on the walls 107. However, removing this coating may require the application of large amounts of heat, which may not be practical. Alternatively, the ion implant system may need to be taken offline so that the coating can be removed, which reduces throughput and efficiency.

Therefore, a system and method to provide a reliable electrical reference to the plasma 150 for stable and repeatable doping process by reducing or eliminating coatings that are deposited in a plasma-based implantation system is needed.

SUMMARY

A system and method for the removal of deposited material from the walls of a plasma chamber is disclosed. The system may have two modes; a normal operating mode and a cleaning mode. During the cleaning mode, the plasma is biased at a higher potential than the walls, thereby causing energetic ions from the plasma to strike the plasma wall, dislodging material previously deposited. This may be achieved through the use of one or more electrodes disposed in the plasma chamber, which are maintained at a first voltage during normal operating mode, and a second, higher voltage, during the cleaning mode.

In one embodiment, an ion implant system is disclosed, which comprises a plasma chamber defined by a plurality of chamber walls; an electrode disposed within the plasma chamber and electrically isolated from the chamber walls; a plasma chamber power supply for providing a first voltage to the chamber walls; an electrode power supply for providing a second voltage to the electrodes, wherein the first voltage and the second voltage are different during a cleaning mode.

In a second embodiment, a method of operating an ion implant system is disclosed, which comprises: creating a plasma within a plasma chamber, defined by a plurality of chamber walls; providing an electrode within the plasma chamber, electrically isolated from the chamber walls; biasing the chamber walls and the electrode at the same voltage during a normal operating mode; and biasing the electrode at a first voltage, higher than a second voltage applied to the chamber walls during a cleaning mode.

In a third embodiment, a method of operating an ion implant system is disclosed. This method comprises creating a plasma within a plasma chamber, defined by a plurality of chamber walls; providing an electrode within said plasma chamber, electrically isolated from the chamber walls; biasing the chamber walls and the electrode at a first voltage during a normal operating mode; biasing a substrate at a voltage less than the first voltage; implanting ions from the plasma into the substrate during the biasing at the voltage less than the first voltage during the normal operating mode; biasing the electrode at a second voltage higher than a third voltage applied to the chamber walls after the implanting, wherein ions from the plasma are attracted toward the chamber walls to clean the chamber walls during a cleaning mode.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
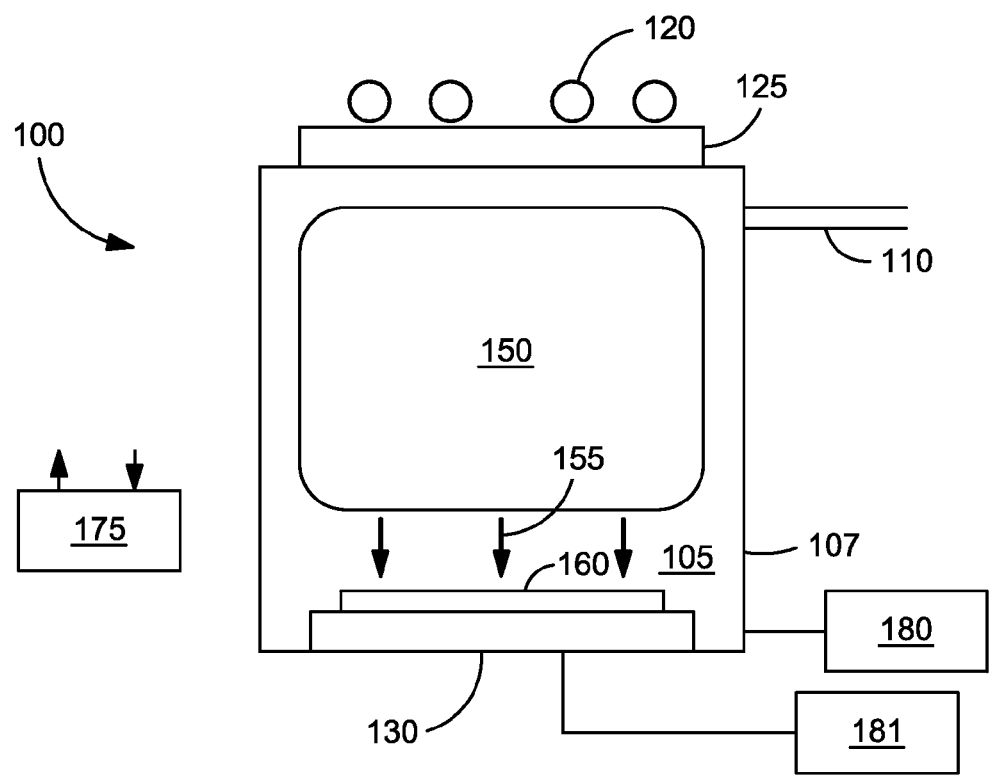
FIG. 1 shows an embodiment of an ion implant system according to the prior art.
Figure 2:
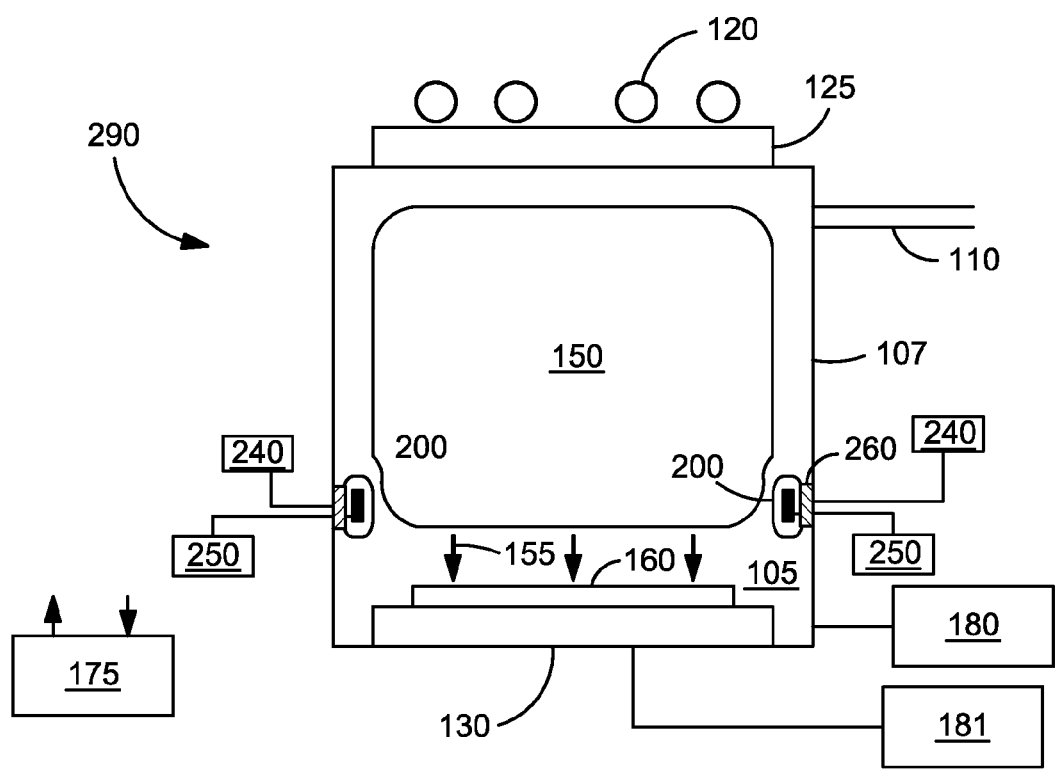
FIG. 2 shows an embodiment of an ion implant system that can be used in one embodiment.

FIG. 2 shows a representative diagram of the ion implant system 290 according to one embodiment. Components which retain their function from FIG. 1 are given the same reference designators and are not described again.

As described above, the positive ions 155 in the plasma 150 are attracted to the substrate 160 by the difference in potential between the chamber walls 107 (and/or the plasma 150) and the platen 130. The ions 155 from the plasma 150 are attracted as long as the walls 107 are biased at a voltage greater than that applied to the substrate 160. Thus, the bias provided by plasma chamber power supply 180 is greater than the bias provided by bias power supply 181 in order to attract ions 155 toward the substrate 160.

The plasma 150 is typically referenced to the voltage of the walls 107. Thus, if the walls 107 are positively biased, such as by plasma chamber power supply 180, the plasma 150 is likewise positively biased, for example, at a potential that may be slightly higher than the potential of the walls 107. Ions 155 from the plasma 150 gain some energy through the plasma potential, which may be typically 10-30 V, and deposit onto the chamber walls 107. Since the walls 107 may provide a cooler surface, ions 155 and various forms of neutrals from the plasma 150 may condense on the walls 107. Thus, deposition may be a major contributor to coating on the chamber walls 107.

Figure 3:
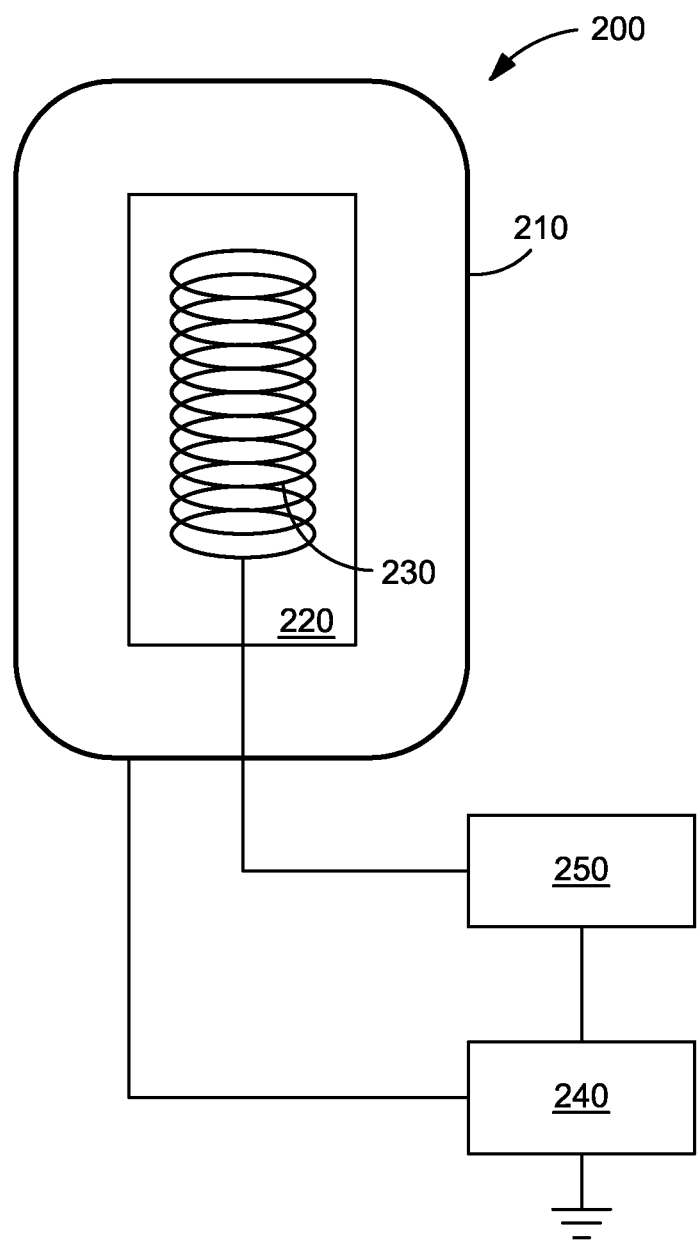
FIG. 3 shows an enlarged view of an electrode used in the ion implant system of FIG. 2.

To provide a stable doping condition, by providing a good electrical reference on the walls 107 for the plasma 150, electrodes 200 are introduced into the interior of the plasma chamber 105. As best seen in FIG. 3, these electrodes have a conductive outer surface 210, which faces the interior of the plasma chamber 105. The conductive outer surface 210 may be constructed of the same material used to make the chamber walls 107, such as graphite, silicon, silicon carbide, etc. In some embodiments, a heating element 230, such as a conductive coil, may be disposed within the electrode 200. In these embodiments, an insulating material 220 is disposed inside the electrode 200 to electrically, but not thermally, isolate the outer surface 210 from the heating element 230. The outer surface 210 and the heating element 230 are each in communication with a respective power supply 240, 250. In some embodiments, the electrode power supply 240 may be a DC power supply providing a DC bias of between −1000 and +1000 V. The heater power supply 250 may provide an AC waveform having an amplitude of between 10-100 V. This heater power supply 250 may be referenced to the electrode power supply 240.

FIG. 2 also shows an insulating material 260 disposed between the outer surface of the electrode 200 and the chamber walls 107. This may alleviate operation problems because the voltages applied to the walls 107 and the electrodes 200 may differ in certain conditions, as described in more detail below.

In addition, a controller 175 is shown. The controller 175 can be or may include a general-purpose computer or network of general-purpose computers that may be programmed to perform desired input/output functions. The controller 175 can also include other electronic circuitry or components, such as application specific integrated circuits, other hardwired or programmable electronic devices, discrete element circuits, etc. The controller 175 may also include communication devices, data storage devices, and software. The controller 175 is in communication with a non-transitory medium. This storage element contains instructions, which when executed by the controller 175, perform the steps and operations described herein.

Figure 4:
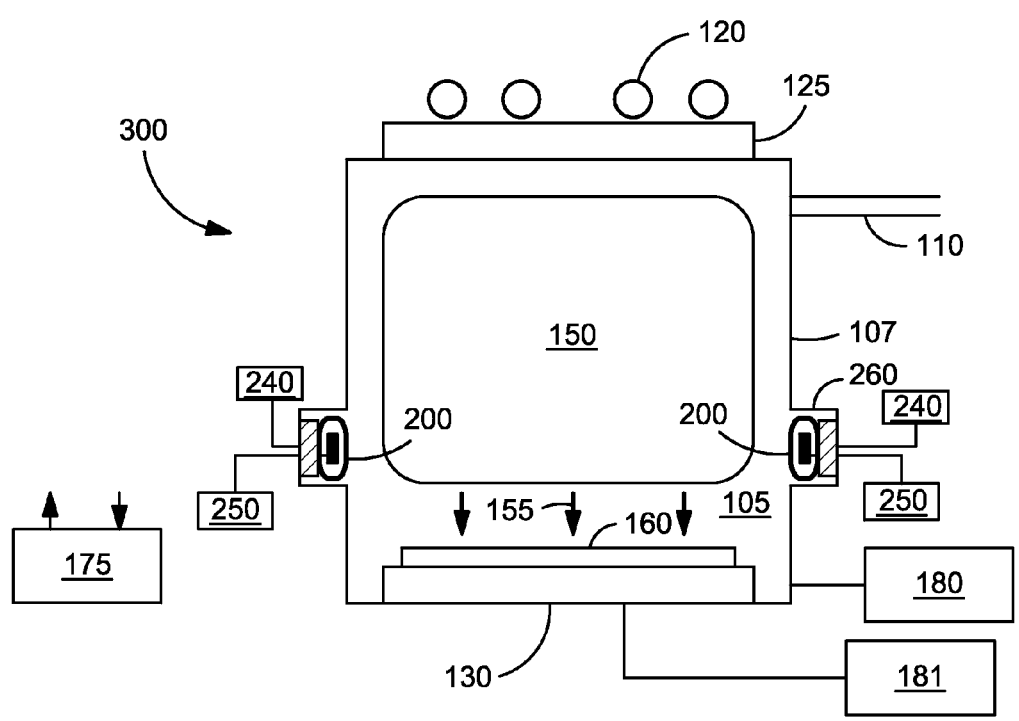
FIG. 4 shows an embodiment of an ion implant system that can be used in another embodiment.

FIG. 4 shows a second embodiment of the ion implant system 300. In this embodiment, the walls 107 include a recess into which the electrodes 200 are disposed. In this way, the interior of the plasma chamber 105 may be smooth, with no penetrating components, as was shown in FIG. 2. The electrodes 200 may be identical to those described in conjunction with FIG. 3.

In each of these embodiments, two electrodes 200 are shown as being disposed on two opposite walls 107 of the plasma chamber 105. However, other embodiments are also possible. For example, more or fewer electrodes may be used, and their location can be modified as needed. For example, there may also be single electrode, surrounding the entire plasma chamber 105.

Having defined the structure of the ion implant system 290, 300, its operation during both normal operating mode and cleaning/conditioning mode will be described. The steps described herein for the normal operating mode and the cleaning/conditioning mode are initiated by controller 175, which is in communication with a storage element, having instructions, which when executed, perform this sequences.

During normal operating mode, the voltage applied by electrode power supply 240 is the same as that being applied by plasma chamber power supply 180. Thus, the electrodes 200 will be at the same voltage as the walls 107. As described above, the voltage applied by plasma chamber power supply 180 to the walls 107 is greater than that applied by bias power supply 181 to the platen 130. In some embodiments, this voltage may be in the range of 100-10,000 V, while the voltage applied by bias power supply 181 may be electrically ground. In other embodiments, the voltage applied by power supplies 180 and 240 may be ground, while the voltage applied by bias power supply 181 to the platen 130 may be negative, such as between −100 and −10,000 volts. Other configurations of voltages are also possible and within the scope of the disclosure.

By maintaining the electrodes 200 at the same bias voltage as the walls 107, the electrodes 200 have minimal effect on the operation of the ion implant system 290, 300 during normal operation. This configuration is used to implant ions 155 into the substrate 160, as is traditionally done. As described above, deposition tends to occur within the plasma chamber 105 during the normal operating mode. Therefore, in some embodiments, a heating element 230 is disposed within the electrodes 200. This heating element 230 may be activated during normal operating mode. By heating the electrodes 200, the hot electrodes 200 may be more resistant to deposition during normal operating mode. These electrodes 200 may be heated to temperatures, such as 400° C. or greater. In other embodiments, the heating element 230 is not utilized. In these embodiments, deposition is more likely to occur on the electrodes 200 during normal operating mode. Thus, over time, deposition will form on the walls 107, and optionally on the electrodes 200 (depending on whether a heating element 230 is employed).

To remove this coating and provide a reliable electrical reference to the plasma 150 for stable and repeatable doping process, a cleaning/conditioning mode is employed. During the cleaning/conditioning mode, the walls 107 may be cleaned, the plasma chamber 105 may be conditioned, or both operations may occur. It is not necessary for both events to occur during the cleaning/conditioning mode. A cleaning mode effectuates removal of deposited material from the walls 107. As described above, the plasma 150 is typically referenced to the highest voltage proximate to the plasma 150. During normal operation, this voltage is that used to bias the chamber walls 107. However, in cleaning/conditioning mode, the electrodes 200 are biased to a higher voltage than the walls 107. In other words, electrode power supply 240 supplies a greater voltage than plasma chamber power supply 180. This voltage may be 100 or more volts greater than that applied by plasma chamber power supply 180. In this way, the plasma 150 is referenced to the voltage supplied by electrode power supply 240. Since this voltage is higher than that applied to the walls 107, the walls 107 effectively become cathodes and energetic positive ions 155 are attracted to the walls 107. These ion collisions may contain sufficient energy to clean or otherwise remove the deposition coating that had built up on the walls 107 during normal operating mode.

In the embodiment where a heating element 230 is used, the heat deters deposition of material on the electrode 200. Thus, this single step cleaning sequence is sufficient to remove deposition from all surfaces within the plasma chamber 105, and provide a reliable reference potential for the plasma. However, in embodiments where a heating element 230 is not utilized, a two step cleaning/conditioning process may be used to provide reliable reference potential for the plasma inside the plasma chamber 105. The first step may be as described above, which serves to remove deposition from the chamber walls 107. In the second step, the voltage applied by plasma chamber power supply 180 is greater than that applied by electrode power supply 240. In this way, ions 155 are attracted to the electrodes 200 and serve to remove any deposition from these surfaces. In other words, in one step, the plasma 150 is referenced to the electrodes 200, and deposition is removed from the chamber walls 107. In the second step, the plasma 150 is referenced to the walls 107, and deposition is removed from the electrode 200. These steps can be performed in any order.

In another embodiment, a heating element 230 is not utilized, but the single step cleaning sequence described above is used. This may be acceptable if the surface area of the electrodes 200 is small relative to the walls 107.

The cleaning mode can be activated for a duration of time necessary to remove the deposition from the chamber walls 107. For example, in some embodiments, the cleaning mode may be activated for several minutes after hours of normal operating mode. For example, cleaning mode may be used 5-30 minutes after every 5-20 hours of continuous normal operating mode. In other embodiments, the cleaning mode may be activated when substrates 160 are being exchanged to and from the ion implant system 290, 300.

Figure 5:
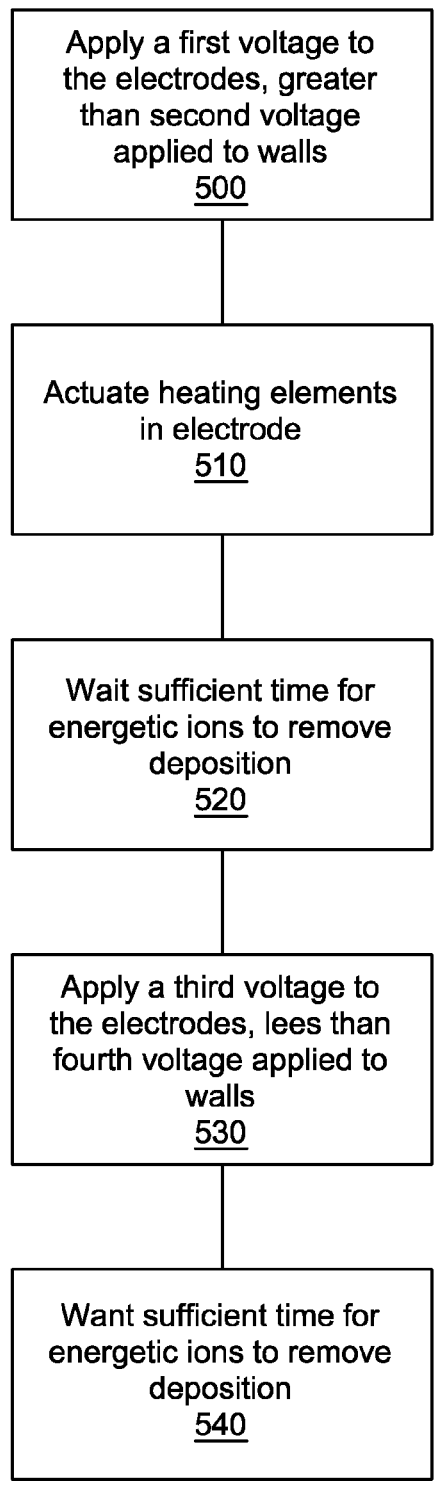
FIG. 5 shows a flowchart that may be used during the cleaning mode.

FIG. 5 shows a flow chart showing the operation of the ion implant system 290 during the cleaning mode. First, as described above, a first voltage is applied to the electrodes 200, where the first voltage is set to a level greater than a second voltage being applied to the chamber walls 107, as shown in step 500. The second voltage applied to the chamber walls 107 may be the same as is used during normal operating mode. In other embodiments, the second voltage applied to the chamber walls 107 may be less than that typically used for normal operating mode. However, in all embodiments, the first voltage applied to the electrodes 200 is greater than the second voltage applied to the walls 107.

In embodiments where a heating element 230 is utilized, this heating element is actuated, as shown in step 510. This heating element may be a conductive coil which is heated by applying an alternating current thereto, such as by the use of heater power supply 250. The heater power supply 250 may be referenced to the electrode power supply 240. The electrode 200 is heated to a temperature sufficient to deter or prevent the deposition of material on the electrode 200. The electrode 200 may also be heated during normal operation.

The electrode 200 remains at this elevated voltage for a sufficient time to remove the deposition from the walls 107 of the plasma chamber 105, as shown in step 520. In embodiments where a heating element 230 is used, the cleaning process terminates after step 520.

In other embodiments, a second cleaning step is needed to remove deposition from the electrodes 200. As described above and shown in step 530, a third voltage is applied to the electrodes 200, where this third voltage is less than a fourth voltage being applied to the walls 107. In some embodiments, the voltage applied to the walls 107 is unchanged, and the electrode power supply 240 simply changes from a first voltage, greater than the plasma chamber wall voltage to another voltage less than the plasma chamber wall voltage. As explained above, in this mode, energetic ions 155 will strike the electrodes 200, removing deposition from these components.

The electrode 200 remains at this depressed voltage for a sufficient time to remove the deposition from the electrodes 200, as shown in step 540.

After this step, the chamber walls 107 and the electrodes 200 are cleaned. After this sequence, normal operation may resume.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implant system, comprising:
   a plasma chamber defined by a plurality of chamber walls;
   an electrode disposed within said plasma chamber and electrically isolated from said chamber walls, wherein said electrode comprises a conductive outer surface;
   a plasma chamber power supply for providing a first voltage to said chamber walls;
   an electrode power supply for providing a second voltage to said electrode, wherein said first voltage and said second voltage are different during a cleaning mode;
   a heating element disposed within said electrode; and
   a heater power supply for providing a voltage to said heating element to heat said electrode.

2. The ion implant system of claim 1, where said heater power supply is referenced to said electrode power supply.

3. A method of operating an ion implant system, comprising:

creating a plasma within a plasma chamber, defined by a plurality of chamber walls;

providing an electrode within said plasma chamber, electrically isolated from said chamber walls;

biasing said chamber walls and said electrode at the same voltage during a normal operating mode; and biasing said electrode at a first voltage more positive than a second voltage applied to said chamber walls during a cleaning mode, wherein ions from said plasma are attracted toward said chamber walls to clean said chamber walls during said cleaning mode.

4. The method of claim 3, wherein said electrode comprises an internal heating element, and further comprising heating said electrode during said normal operating mode.

5. The method of claim 4, comprising heating said electrode during said cleaning mode.

6. The method of claim 3, further comprising biasing said electrode at a third voltage lower than said second voltage during a second cleaning mode.

7. A method of operating an ion implant system, comprising:

creating a plasma within a plasma chamber, said plasma chamber defined by a plurality of chamber walls;

providing an electrode within said plasma chamber, electrically isolated from said chamber walls;

biasing said chamber walls and said electrode at a first voltage during a normal operating mode;

biasing a substrate at a voltage less than said first voltage;

implanting ions from said plasma into said substrate during said biasing at said voltage less than said first voltage during said normal operating mode; and biasing said electrode at a second voltage more positive than a third voltage applied to said chamber walls after said implanting, wherein ions from said plasma are attracted toward said chamber walls to clean said chamber walls during a cleaning mode.

8. The method of claim 7, further comprising heating said electrode during said normal operating mode.

9. The method of claim 8, further comprising heating said electrode during said cleaning mode.

10. The method of claim 7, further comprising biasing said electrode at a fourth voltage lower than said third voltage after said implanting, wherein ions from said plasma are attracted toward said electrode to clean said electrode.

11. The method of claim 7, wherein after said cleaning mode is completed, further comprising:

biasing said chamber walls and said electrode at said first voltage during said normal operating mode; and biasing a substrate at a voltage less than said first voltage to implant ions from said plasma into said substrate during said normal operating mode.

12. The method of claim 7, wherein said implanting of substrates is repeated a plurality of times for a plurality of substrates prior to executing said cleaning mode.

13. The method of claim 7, wherein said cleaning mode is executed for between 5 and 30 minutes.

* * * * *